(12) United States Patent
Yim et al.

(10) Patent No.: US 9,059,433 B2
(45) Date of Patent: Jun. 16, 2015

(54) DISPLAY DEVICE AND METHOD OF MANUFACTURING THE SAME

(71) Applicant: Samsung Display Co., Ltd., Yongin-City, Gyeonggi-Do (KR)

(72) Inventors: Sang-Hoon Yim, Yongin (KR); Seong-Min Kim, Yongin (KR); Kyung-Ho Kim, Yongin (KR); Kwan-Hyun Cho, Yongin (KR); Young-Woo Song, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 53 days.

(21) Appl. No.: 14/057,754

(22) Filed: Oct. 18, 2013

(65) Prior Publication Data
US 2014/0160411 A1 Jun. 12, 2014

(30) Foreign Application Priority Data
Dec. 6, 2012 (KR) .................. 10-2012-0141200

(51) Int. Cl.
*G02F 1/1335* (2006.01)
*H01L 51/56* (2006.01)
*H01L 51/52* (2006.01)

(52) U.S. Cl.
CPC .......... *H01L 51/56* (2013.01); *G02F 1/133553* (2013.01); *H01L 51/5271* (2013.01)

(58) Field of Classification Search
CPC ............... G02F 1/133553; G02F 1/133555; G02F 1/136227; G02F 1/133504; G02F 2203/021; G02F 2203/133562; G02F 1/133371; G02F 1/13351
USPC .................................... 349/113, 114
See application file for complete search history.

(56) References Cited

U.S. PATENT DOCUMENTS

| 8,525,406 B2 * | 9/2013 | Kim et al. ..................... 313/512 |
| 2006/0158110 A1 | 7/2006 | Kim et al. |
| 2009/0236981 A1 * | 9/2009 | Chang et al. .................. 313/504 |
| 2010/0201609 A1 | 8/2010 | Kim |

FOREIGN PATENT DOCUMENTS

| JP | 2004-258128 | 9/2004 |
| JP | 2005-332616 | 12/2005 |
| JP | 2006-011043 | 1/2006 |
| KR | 10-0700006 | 3/2007 |
| KR | 10-0937865 | 1/2010 |
| KR | 10-1015845 | 2/2011 |

* cited by examiner

*Primary Examiner* — Mike Qi
(74) *Attorney, Agent, or Firm* — Robert E. Bushnell, Esq.

(57) ABSTRACT

A display device and a method of manufacturing the same. The display device includes: a substrate; and a reflection member that is disposed on a surface of the substrate and has a first thickness in a first reflection region corresponding to a light-emitting region and a second thickness in a second reflection region corresponding to a non-light-emitting region.

20 Claims, 8 Drawing Sheets

DISPLAY DEVICE AND METHOD OF MANUFACTURING THE SAME

CLAIM PRIORITY

This application makes reference to, incorporates the same herein, and claims all benefits accruing under 35 U.S.C. §119 from an application earlier filed in the Korean Intellectual Property Office on 6 Dec. 2012 and there duly assigned Serial No 10-2012-0141200.

BACKGROUND OF THE INVENTION

1. Field of the Invention

The present invention generally relates to a display device and a method of manufacturing the same.

2. Description of the Related Art

Conventional display devices have recently been replaced by portable thin flat panel display devices. These portable thin flat panel display devices have the advantage of size and weight as compared to conventional displays.

The above information disclosed in this Related Art section is only for enhancement of understanding of the background of the invention and therefore it may contain information that does not form the prior art that is already known to a person of ordinary skill in the art.

SUMMARY OF THE INVENTION

The present invention provides a display device that may perform a mirror function with a maximum reflectance and maximum reflection quality without reducing display quality efficiency.

According to an aspect of the present invention, there may be provided a display device including: a substrate; and a reflection member that may be disposed on a surface of the substrate and has a first thickness in a first reflection region corresponding to a light-emitting region and a second thickness in a second reflection region corresponding to a non-light-emitting region.

The first thickness may be less than the second thickness, and a reflectance of the reflection member in the first reflection region may be lower than a reflectance of the reflection member in the second reflection region.

The reflection member may be formed of at least one selected from the group consisting of aluminum (Al), chromium (Cr), silver (Ag), iron (Fe), platinum (Pt), mercury (Hg), nickel (Ni), tungsten (W), vanadium (V), and molybdenum (Mo).

A transmittance of the reflection member may range from about 50% to about 95%.

The reflection member in the second reflection region may include a first reflection film and a second reflection film, and the reflection member in the first reflection region includes the second reflection film.

The display device may further include a second substrate that includes a plurality of pixels including the light-emitting region and the non-light-emitting region on a surface of the second substrate facing the reflection member, and includes an organic light-emitting element including a first electrode, a second electrode, and a light-emitting layer disposed between the first electrode and the second electrode in the light-emitting region.

The display device may further include: a first substrate on which a pixel electrode may be formed in the light-emitting region; a second substrate on which a common electrode facing the pixel electrode may be formed; and a liquid crystal layer that may be disposed between the first substrate and the second substrate.

According to another aspect of the present invention, there may be provided a display device including: a substrate; and a reflection member that may be disposed on a surface of the substrate, has a first reflection region corresponding to a light-emitting region and a second reflection region corresponding to a non-light-emitting region, and includes a first reflection film that may be formed with a first thickness in the second reflection region and a second reflection film that may be formed with a second thickness in the first reflection region and in the second reflection region in which the first reflection film may be formed.

The second thickness may be less than the first thickness, and a reflectance of the second reflection film may be lower than a reflectance of the first reflection film.

The first reflection film and the second reflection film may be formed of a same material or different materials.

Each of the first reflection film and the second reflection film may have a single-layer structure formed of at least one metal selected from the group consisting of aluminum (Al), chromium (Cr), silver (Ag), iron (Fe), platinum (Pt), mercury (Hg), nickel (Ni), tungsten (W), vanadium (V), and molybdenum (Mo), or a multi-layer structure including any of the metals.

A transmittance of the second reflection film may range from about 50% to about 95%, and a thickness of the second reflection film may range from about 60 Å to about 180 Å.

The display device may further include a second substrate that includes a plurality of pixels having the light-emitting region and the non-light-emitting region on a surface of the second substrate facing the reflection member, and includes an organic light-emitting element including a first electrode, a second electrode, and a light-emitting layer disposed between the first electrode and the second electrode.

The display device may further include: a first substrate on which a pixel electrode may be formed in the light-emitting region; a second substrate on which a common electrode facing the pixel electrode may be formed; and a liquid crystal layer that may be disposed between the first substrate and the second substrate.

According to another aspect of the present invention, there may be provided a method of manufacturing a display device including a light-emitting region and a non-light-emitting region, the method including: forming a first reflection member with a first thickness in a first reflection region corresponding to the light-emitting region on a surface of a substrate; and forming a second reflection member with a second thickness in a second reflection region corresponding to the non-light-emitting region on the surface of the substrate.

The first reflection member and the second reflection member may be simultaneously formed by forming a first reflection film on the surface of the substrate and then removing a portion of the first reflection film in the first reflection region.

The first reflection member and the second reflection member may be separately formed by forming a first reflection film on the surface of the substrate and then removing the first reflection film in the first reflection region, and forming a second reflection film on the surface of the substrate from which the first reflection film may be removed.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

As used herein, the term "and/or" includes any and all combinations of one or more of the associated listed items. Expressions such as "at least one of," when preceding a list of elements, modify the entire list of elements and do not modify the individual elements of the list.

As the invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In the description of the present invention, certain detailed explanations of related art are omitted when it is deemed that they may unnecessarily obscure the essence of the invention.

The terms "first," "second," and the like, "primary," "secondary," and the like, as used herein do not denote any order, quantity, or importance, but rather are used to distinguish one element, region, component, layer, or section from another.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises" and/or "comprising" used herein specify the presence of stated features, integers, steps, operations, members, components, and/or groups thereof, but do not preclude the presence or addition of one or more other features, integers, steps, operations, members, components, and/or groups thereof.

In the drawings, thicknesses of layers and regions are exaggerated for clarity. It will be understood that when an element or layer is referred to as being "formed on," another element or layer, it can be directly or indirectly formed on the other element or layer. That is, for example, intervening elements or layers may be present.

In portable thin flat panel display devices a mirror function may be incorporated using a reflection of external light as well as a display function.

In order to perform a mirror function, a liquid crystal display (LCD) device may include a semi-transparent mirror. However, once the semi-transparent mirror is used, since the amount of light transmitted is reduced, transmission efficiency is reduced and reflection efficiency is reduced as well.

Also, since external light is diffusely reflected due to a plurality of electrodes and other metal layers provided in the LCD device, severe blurring occurs while the mirror function is in effect.

The present invention will now be described more fully with reference to the accompanying drawings, in which exemplary embodiments of the invention are shown.

Figure 1:
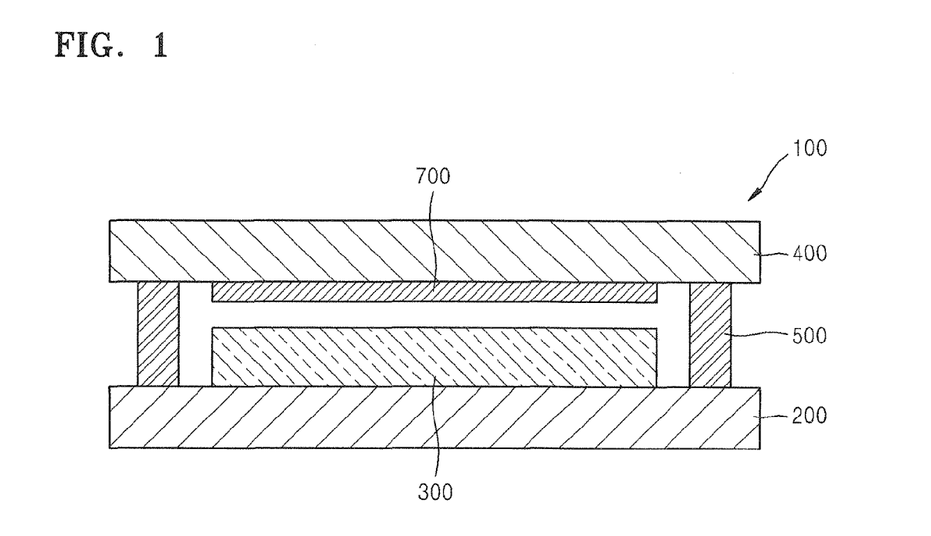
FIG. 1 is a cross-sectional view illustrating a display device according to an embodiment of the present invention.
Figure 2:
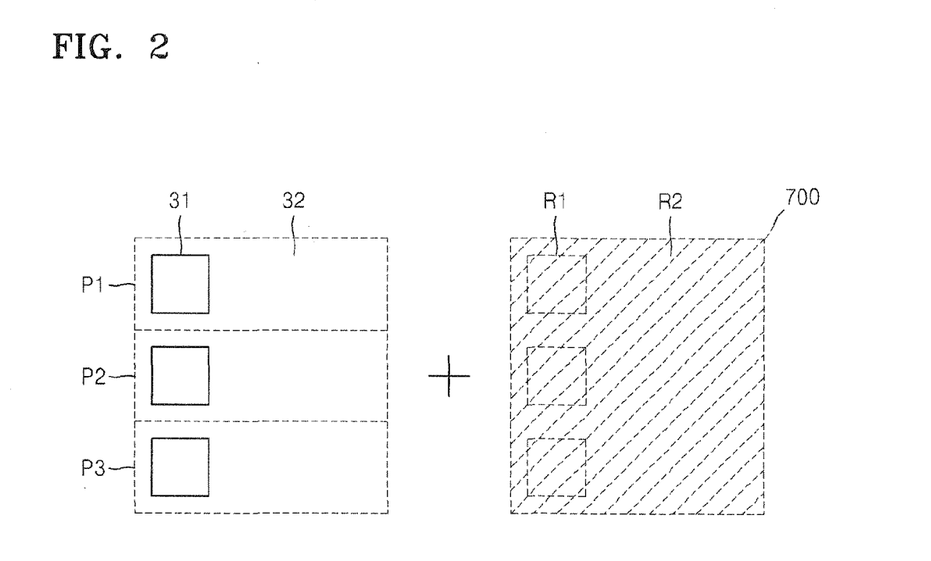
FIG. 2 is a plan view for explaining a process of adhering a first substrate and a second substrate of the display device of FIG. 1.

FIG. 1 is a cross-sectional view illustrating a display device 100 according to an embodiment of the present invention. FIG. 2 is a plan view for explaining a process of adhering a first substrate 200 and a second substrate 400 of the display device 100 of FIG. 2. The left side of FIG. 2 shows a part of a display unit 300 on the first substrate 200, and the right side of FIG. 2 shows a part of a reflection member 700 on the second substrate 400.

Referring to FIG. 1, the display device 100 includes the first substrate 200, the display unit 300 disposed on the first substrate 200, and the second substrate 400.

The first substrate 200 and the second substrate 400 are adhered to each other by using a sealing member 500. A moisture absorbent or a filler may be disposed in a space that may be formed by the sealing member 800 between the first substrate 200 and the second substrate 400.

Each of the first substrate 200 and the second substrate 400 may be formed of a glass material having $SiO_2$ as a main component. However, the first substrate 200 and the second substrate 400 are not limited thereto, and may be formed of a transparent plastic material.

The display unit 300 disposed on the first substrate 200 includes a plurality of pixels. In FIG. 2, the plurality of pixels, for example, three pixels P1, P2, and P3, are illustrated. The three pixels P1, P2, and P3 may be, for example, a red pixel, a green pixel, and a blue pixel.

Each of the pixels P1, P2, and P3 includes a light-emitting region 31 and a non-light-emitting region 32. A circuit for driving the light-emitting region 31 may overlap with the light-emitting region 31. Although not shown in FIG. 1, each of the pixels P1, P2, and P3 may include a transmission region in the non-light-emitting region 32 or the pixels P1, P2, and P3 may have a common transmission region.

The light-emitting region 31 is a region where a light-emitting element directly generates visible light and an image recognized by a user may be formed. The light-emitting region 31 may be formed to have any of various shapes.

The second substrate 400 may be an encapsulation member that seals the display unit 300. The reflection member 700 may be formed on a surface of the second substrate 400. The reflection member 700 may be formed on a surface of the second substrate 400 facing the first substrate 200. Referring to FIG. 2, the reflection member 700 includes a first reflection region R1 and a second reflection region R2 disposed around the first reflection region R1. The first reflection region R1 corresponds to the light-emitting region 31, and the second reflection region R2 corresponds to the non-light-emitting region 32. The reflection member 700 may extend to the sealing member 500 or to the outside of the sealing member 500 while overlapping with the sealing member 500, to be disposed as far as end portions of at least one side from among four sides of the second substrate 400. In this case, the second reflection region R2 may be disposed on the end portions of the second substrate 400.

Figure 3:
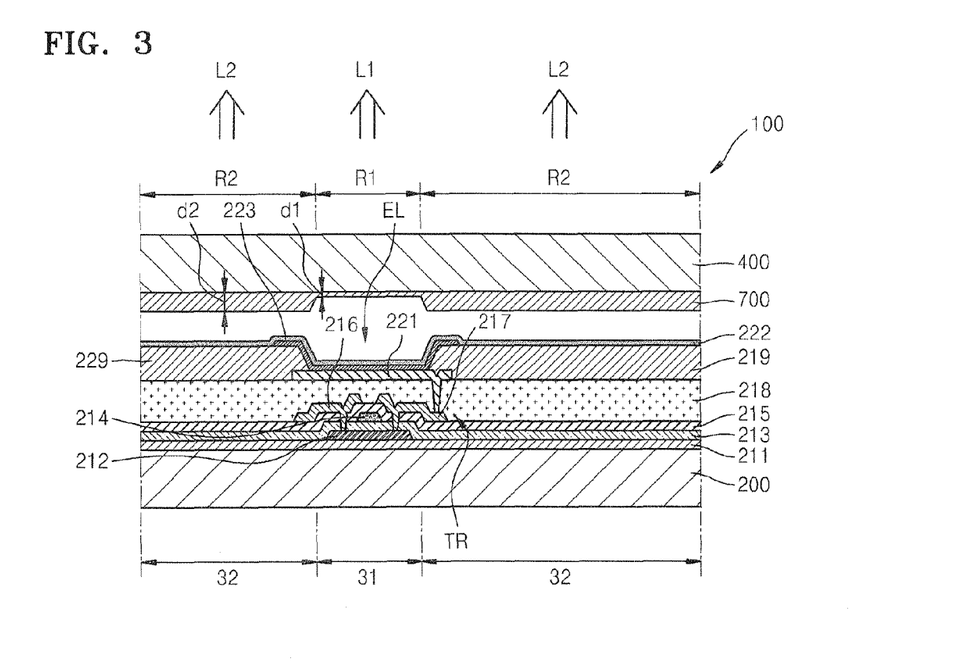
FIG. 3 is a partial cross-sectional view illustrating the display device of FIG. 1.

FIG. 3 is a partial cross-sectional view illustrating the display device 100 of FIG. 1.

Referring to FIG. 3, an organic light-emitting element EL may be disposed in the light-emitting region 31 of each of the pixels formed on the first substrate 200, and a thin-film transistor (TFT) TR may be disposed under the organic light-emitting element EL. The organic light-emitting element EL includes a first electrode 221, a second electrode 222, and an organic layer 223. The organic light-emitting element EL may be electrically connected to the TFT TR that may be disposed under the organic light-emitting element EL.

Although one TFT TR is shown in FIG. 3, the present embodiment is not limited thereto, and a plurality of TFTs and storage capacitors may be disposed, and wires such as a scan line, a data line, and a Vdd line may be further connected to the plurality of TFTs and storage capacitors.

A buffer film 211 may be formed on the first substrate 200, a semiconductor active layer 212 may be formed on the buffer film 211, and a gate insulating film 213, a gate electrode 214, and an interlayer insulating film 215 are formed on the semiconductor active layer 212. The buffer film 211 is not an essential element, and thus may be omitted if necessary. A source electrode 216 and a drain electrode 217 are formed on the interlayer insulating film 215. A passivation film 218 which is an insulating film may be formed to cover the TFT TR. The passivation film 218 may be formed of an inorganic material and/or an organic material.

The first electrode 221 of the organic light-emitting element EL electrically connected to the TFT TR may be formed on the passivation film 218. The first electrode 221 overlaps with the TFT TR and covers the TFT TR.

A pixel defining film 219 formed of an organic and/or inorganic insulating material may be formed on the passivation film 218. An opening through which a portion of the first electrode 221 may be exposed is formed in the pixel defining film 219, and the organic layer 223 and the second electrode 222 are sequentially stacked on the portion of the first electrode 221 exposed through the opening.

The first electrode 221 may have a stacked structure including a transparent conductor and a reflection film. The transparent conductor may be formed of indium tin oxide (ITO), indium zinc oxide (IZO), zinc oxide (ZnO), or $In_2O_3$ having a high work function. The reflection film includes at least one metal selected from the group consisting of silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), molybdenum (Mo) and an alloy thereof.

The second electrode 222 may be formed of Ag, Mg, Al, Pt, Pd, Au, Ni, Nd, Ir, Cr, Li, Ca, Mo, or an alloy thereof. The second electrode 222 may be a thin film having a thickness ranging from about 100 Å to about 300 Å in order to increase a transmittance. Accordingly, the organic light-emitting element EL may be a top emission organic light-emitting element that forms an image toward the second electrode 222.

The organic layer 223 may have a single-layer structure, or a multi-layer structure including at least one of functional layers such as a hole transport layer (HTL), a hole injection layer (HIL), an electron transport layer (ETL), and an electron injection layer (EIL) as well as a light-emitting layer (EML). The organic layer 223 may be formed of a low molecular weight organic material or a high molecular weight organic material. When the organic layer 223 emits red light, green light, and blue light, the EML may be patterned as a red EML, a green EML, and a blue EML respectively according to red subpixels, green subpixels, and blue subpixels. When the organic layer 223 emits white light, the EML may have a multi-layer structure in which a red EML, a green EML, and a blue EML are stacked, or a single-layer structure including a red light-emitting material, a green light-emitting material, and a blue light-emitting material.

The reflection member 700 may be formed on a surface of the second substrate 400 facing the first substrate 200. The reflection member 700 may be a reflector formed of a material that may reflect external light, and may include a predetermined metal. For example, the reflection member 700 may include aluminum (Al), chromium (Cr), silver (Ag), iron (Fe), platinum (Pt), mercury (Hg), nickel (Ni), tungsten (W), vanadium (V), or molybdenum (Mo).

Referring to FIG. 3, a thickness d1 of the reflection member 700 in the first reflection region R1 corresponding to the light-emitting region 31 may be less than a thickness d2 of the reflection member 700 in the second reflection region R2. Preferably, the thickness d1 of the reflection member 700 in the first reflection region R1 may be about ¹⁄₁₀ of the thickness d2 of the reflection member 700 in the second reflection region R2. For example, the thickness d2 of the reflection member 700 in the second reflection region R2 may be about 1000 Å. This is because the thickness d2 of 1000 Å may lead to a transmittance of 0% and a reflectance of 95% or more. The thickness d1 of the reflection member 700 in the first reflection region R1 may be about 100 Å. This is because the thickness d1 of 100 Å may lead to a transmittance of about 50% to about 95%.

The first reflection region R1 and the second reflection region R2 of the reflection member 700 may be formed of the same material. For example, the reflection member 700 having the thickness d1 in the first reflection region R1 may be formed by forming a reflection film on a surface of the second substrate 400 and then etching a portion of the reflection member 700 corresponding to the light-emitting region 31 to partially remove the reflection member 700.

Since the thickness d1 of the reflection member 700 in the first reflection region R1 and the thickness d2 of the reflection member 700 in the second reflection region R2 are different from each other, reflectances of the reflection member 700 in the first reflection region R1 and the reflection member 700 in the second reflection region R2 are different from each other. A reflectance of the reflection member 700 in the first reflection region R1, in which the thickness d1 of the reflection member 700 may be less, is lower than a reflectance of the reflection member 700 in the second reflection region R2, in which the thickness d2 of the reflection member 700 is greater.

Although the reflection member 700 in the first reflection region R1 and the reflection member 700 in the second reflection region R2 are formed of the same material in FIG. 3, the present embodiment is not limited thereto. For example, the reflection member 700 in the first reflection region R1 may be formed of a material having a transmittance higher than that of the reflection member 700 in the second reflection region R2 and may be formed to a thickness less than that of the reflection member 700 in the second reflection region R2.

In the present embodiment, an image may be displayed by using light L1 emitted by the organic light-emitting element EL in the light-emitting region 31, and a mirror function may be performed by using light L2 obtained when external light may be reflected by the reflection member 700 while the organic light-emitting element EL does not emit the light L1. In this case, since the reflection member 700 corresponding to the light-emitting region 31 is included, a diffuse reflection may be minimized and mirror function efficiency may be improved.

Figure 4:
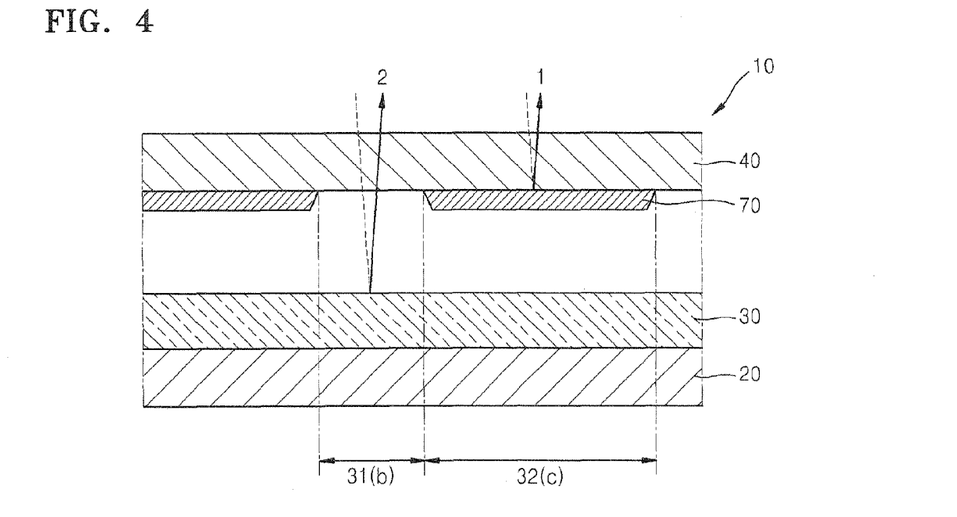
FIG. 4 is a cross-sectional view illustrating a comparative example of the display device of FIG. 1.
Figure 5:
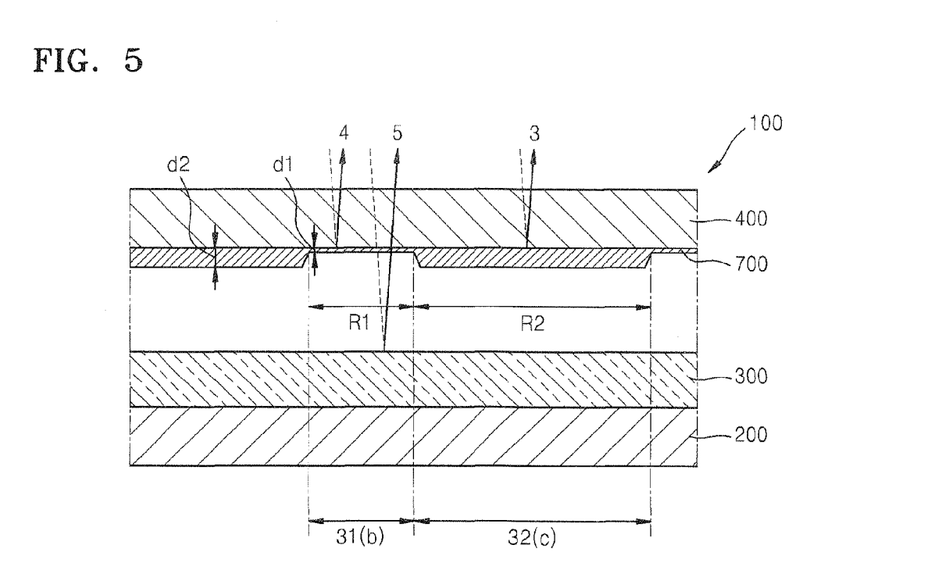
FIG. 5 is a cross-sectional view for explaining a mirror function of the display device of FIGS. 1 through 3.

FIG. 4 is a cross-sectional view illustrating a comparative example of the display device 100 of FIG. 1. FIG. 5 is a cross-sectional view for explaining a mirror function of the display device 100 of FIGS. 1 through 3.

A display device 10 of FIG. 4 includes a first substrate 20, a second substrate 40, and a display unit 30 that may be disposed between the first substrate 20 and the second substrate 40. The display unit 30 disposed on the first substrate 20 includes the light-emitting region 31 in which the organic light-emitting element EL may be disposed and the non-light-emitting region 32 disposed around the light-emitting region 31. A circuit for driving the organic light-emitting element EL may overlap with the organic light-emitting element EL. A reflection member 70 may be disposed on a surface of the second substrate 40 facing the first substrate 20. The reflection member 70 corresponds to the non-light-emitting region 32 of the display unit 30. That is, the display device 10 of FIG. 4 does not include a reflection member corresponding to the light-emitting region 31 on the second substrate 40.

While the organic light-emitting element EL in the light-emitting region 31 does not emit light, the display device 10 performs a mirror function by using a reflection of external light. The reflection of the external light includes a reflection 1 by the reflection member 70 in the non-light-emitting region 32 and a reflection 2 by an electrode constituting the organic light-emitting element EL in the light-emitting region 31. The reflection 1 by the reflection member 70 includes specular reflection, and the reflection 2 by the organic light-emitting element EL includes diffuse reflection.

A ratio of specular reflection to diffuse reflection may be represented by (area of a reflection region×reflectance). When it is assumed that reflections in the light-emitting region 31 are all diffuse reflections, the ratio of specular reflection to diffuse reflection in the comparative example of FIG. 4 is defined as shown in Equation 1.

$$\text{Specular reflection: diffuse reflection} = c \times C : b \times B \quad (1),$$

where c is an area of the non-light-emitting region 32, C is a reflectance of the reflection member 70, b is an area of the light-emitting region 31, and B is a reflectance of the organic light-emitting element EL.

As diffuse reflections increase, the extent of image blurring increases accordingly. Thus, in order to improve mirror quality, diffuse reflection needs to be minimized.

Referring to FIG. 5, the reflection member 700 including the first reflection region R1 corresponding to the light-emitting region 31 and the second reflection region R2 corresponding to the non-light-emitting region 32 may be disposed on a surface of the second substrate 400. The thickness d1 of the reflection member 700 in the first reflection region R1 may be about 1/10 of the thickness d2 of the reflection member 700 in the second reflection region R2. Accordingly, a reflectance of the reflection member 700 in the first reflection region R1 may be lower than a reflectance of the reflection member 700 in the second reflection region R2.

While the organic light-emitting element EL in the light-emitting region 31 does not emit light, the display device 100 performs a mirror function by using a reflection of external light. The reflection of the external light includes a reflection 3 by the reflection member 700 in the second reflection region R2, a reflection 4 by the reflection member 700 in the first reflection region R1, and a reflection 5 by an electrode constituting the organic light-emitting element EL in the light-emitting region 31. The reflections 3 and 4 by the reflection member 700 include specular reflections, and the reflection 5 by the organic light-emitting element EL includes diffuse reflection.

Accordingly, a ratio of specular reflection to diffuse reflection may be defined as shown in Equation 2.

$$\text{Specular reflection: diffuse reflection} = c \times C + b \times A : b \times B \times A' \times A' \quad (2),$$

where c is an area of the non-light-emitting region 32, C is a reflectance of the reflection member 700 in the second reflection region R2, a is a reflectance of the reflection member 700 in the first reflection region R1, A' is a transmittance of the reflection member 700 in the first reflection region R1, b is an area of the light-emitting region 31, and B is a reflectance of the organic light-emitting element EL.

A specular reflection component in Equation 2 is higher by (b×A) than a specular reflection component in Equation 1, and a diffuse reflection component in Equation 2 is lower by (b×B×A'×A') than a diffuse reflection component in Equation 1. Accordingly, since specular reflection by the reflection member 700 in the first reflection region R1 corresponding to the light-emitting region 31 is increased and diffuse reflection is minimized, blurring may be effectively prevented and mirror and display functions of the display device 100 may be efficiently performed.

Figure 6:
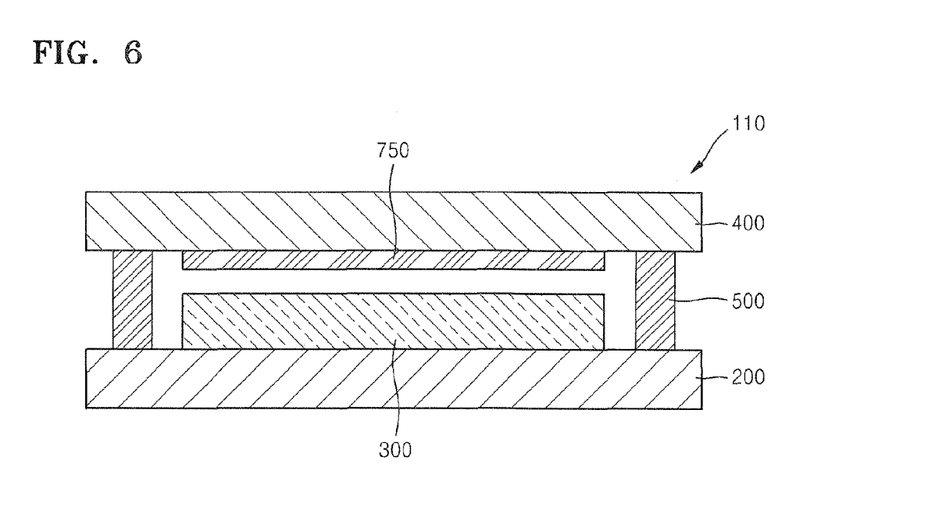
FIG. 6 is a cross-sectional view illustrating a display device according to another embodiment of the present invention.
Figure 7:
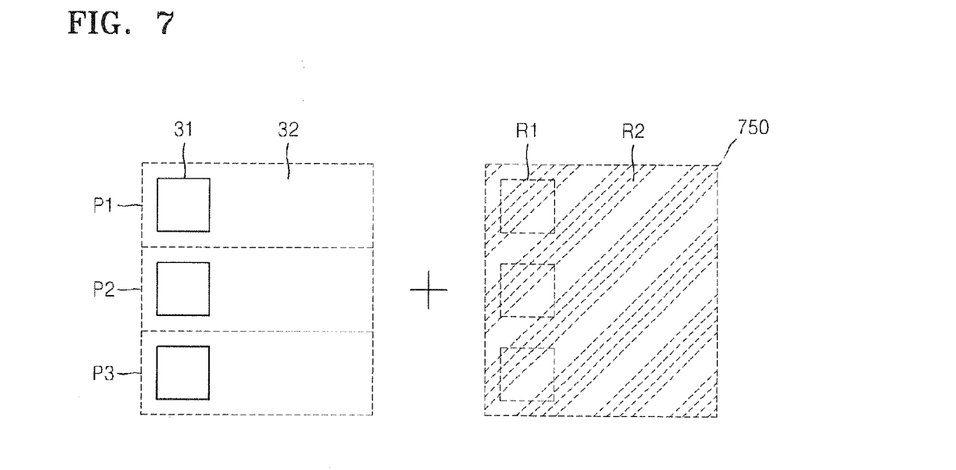
FIG. 7 is a plan view for explaining a process of adhering a first substrate and a second substrate of the display device of FIG. 6.

FIG. 6 is a cross-sectional view illustrating a display device 110 according to another embodiment of the present invention. FIG. 7 is a plan view for explaining a process of adhering the first substrate 200 and the second substrate 400 of the display device 110 of FIG. 6. The left side of FIG. 7 shows a part of the display unit 300 on the first substrate 200 and the right side of FIG. 7 shows a part of a reflection member 750 of the second substrate 400.

Referring to FIG. 6, the display device 110 includes the first substrate 200, the display unit 300 disposed on the first substrate 200, and the second substrate 400.

The first substrate 200 and the second substrate 400 are adhered to each other by using the sealing member 500. A moisture absorbent or a filler may be disposed in a space that may be formed by the sealing member 500 between the first substrate 200 and the second substrate 400.

Each of the first substrate 200 and the second substrate 400 may be formed of a glass material having $SiO_2$ as a main component. However, the first substrate 200 and the second substrate 400 are not limited thereto and may be formed of a transparent plastic material.

The display unit 300 disposed on the first substrate 200 includes a plurality of pixels. In FIG. 7, the plurality of pixels, for example, three pixels P1, P2, and P3, are illustrated. The three pixels P1, P2, and P3 may be, for example, a red pixel, a green pixel, and a blue pixel.

Each of the pixels P1, P2, and P3 includes the light-emitting region 31 and the non-light-emitting region 32. A circuit for driving the light-emitting region 31 overlaps with the light-emitting region 31. Although not shown in FIG. 6, each of the pixels P1, P2, and P3 may include a transmission region in the non-light-emitting region 32 or the pixels P1, P2, and P3 may have a common transmission region.

The light-emitting region 31 may be a region where a light-emitting element directly generates visible light and an image recognized by a user may be formed. The light-emitting region 31 may be formed to have any of various shapes.

The second substrate 400 may be an encapsulation member that seals the display unit 300. The reflection member 750 may be formed on a surface of the second substrate 400. The reflection member 750 may be formed on a surface of the second substrate 400 facing the first substrate 200. Referring to FIG. 7, the reflection member 750 may include the first reflection region R1 and the second reflection region R2 disposed around the first reflection region R1. The first reflection region R1 corresponds to the light-emitting region 31 and the second reflection region R2 corresponds to the non-light-emitting region 32. The reflection member 750 extends to the sealing member 500 or to the outside of the sealing member 500 while overlapping with the sealing member 500, to be disposed on end portions of at least one side from among four sides of the second substrate 400. In this case, the second reflection region R2 may be disposed on the end portions of the second substrate 400.

Figure 8:
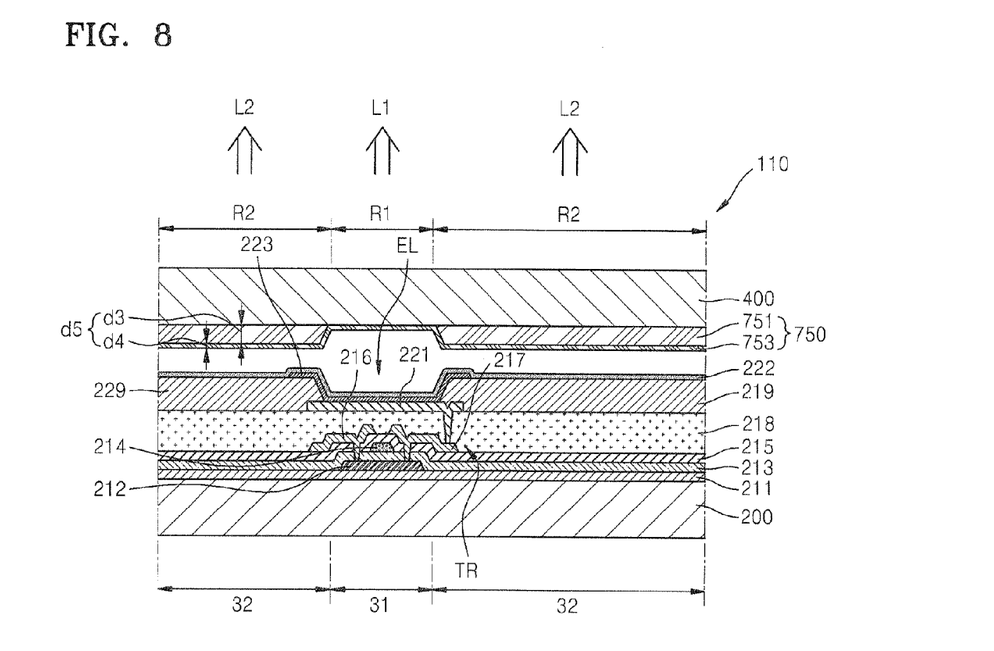
FIG. 8 is a cross-sectional view illustrating a display device according to another embodiment of the present invention.

FIG. 8 is a partial cross-sectional view illustrating the display device 110 of FIG. 6.

Referring to FIG. 8, an organic light-emitting element EL may be disposed in the light-emitting region 31 of each of the pixels and a TFT TR may be disposed under the organic light-emitting element EL.

Although one TFT TR is shown in FIG. 8, the present embodiment is not limited thereto and a plurality of TFTs and storage capacitors may be disposed and wires such as a scan line, a data line, and a Vdd line may be further connected to the plurality of TFTs and storage capacitors. The organic light-emitting element EL may include the first electrode 221, the second electrode 222, and the organic layer 223. The organic light-emitting element EL may be electrically connected to the TFT TR that may be disposed under the organic light-emitting element EL. The organic light-emitting element EL and the TFT TR of FIG. 8 are the same as the organic light-emitting element EL and the TFT TR of FIG. 3, and thus a detailed explanation thereof will not be given here.

The reflection member 750 may be formed on a surface of the second substrate 400 facing the first substrate 200. The reflection member 750 may be a reflector formed of a material that may reflect external light, and may include a predetermined metal.

Referring to FIG. 8, the reflection member 750 may include a first reflection film 751 and a second reflection film 753. The reflection member 750 in the first reflection region R1 corresponding to the light-emitting region 31 may include the second reflection film 753. The reflection member 750 in the second reflection region R2 corresponding to the non-light-emitting region 32 may include the first reflection film 751 and the second reflection film 753 which are sequentially stacked from the second substrate 400. Each of the first reflection film 751 and the second reflection film 753 may have a single-layer structure formed of a material including Al, Cr, Ag, Fe, Pt, Hg, Ni, W, V, or Mo. Alternatively, each of the first reflection film 751 and the second reflection film 753 may have a multi-layer structure in which any of the metals may be disposed between transparent conductive metal oxides. For example, each of the first reflection film 751 and the second reflection film 753 may have a three-layer structure such as ITO/Ag/ITO. A thickness d4 of the second reflection film 753 may be less than a thickness d3 of the first reflection film 751.

A thickness of the reflection member 750 in the first reflection region R1 is equal to the thickness d4 of the second reflection film 753. A thickness of the reflection member 750 in the second reflection region R2 is equal to a sum d5 of the thickness d3 of the first reflection film 751 and the thickness d4 of the second reflection film 753. Preferably, the thickness d4 of the reflection member 750 in the first reflection region R1 may be about 1/10 of the thickness d5 of the reflection member 750 in the second reflection region R2. For example, the thickness d5 of the reflection member 750 in the second reflection region R2 may be about 1000 Å. This is because the thickness d5 of 1000 Å may lead to a transmittance of 0% and a reflectance of 95% or more. The thickness d4 of the reflection member 750 in the first reflection region R1 may be about 100 Å. This is because the thickness d4 of 100 Å may lead to a transmittance of about 50% to about 95%.

The first reflection film 751 and the second reflection film 753 of the reflection member 750 may be formed of the same material. However, the present embodiment is not limited thereto, and as long as a transmittance of the reflection member 750 in the first reflection region R1 may be higher than a transmittance of the reflection member 750 in the second reflection region R2, the first reflection film 751 and the second reflection film 753 may be formed of different materials. For example, the reflection member 750 may be formed by forming the first reflection film 751 on a surface of the second substrate 400, completely etching a portion of the first reflection film 751 corresponding to the light-emitting region 31 to remove the first reflection film 751 corresponding to the light-emitting region 31, and forming the second reflection film 753 formed of the same material as or a different material from the first reflection film 751 on an entire surface of the second substrate 400.

Since the thickness d4 of the reflection member 750 in the first reflection region R1 may be different from the thickness d5 of the reflection member 750 in the second reflection region R2, reflectances of the reflection member 750 in the first reflection region R1 and the reflection member 750 in the second reflection region R2 are different from each other. A reflectance of the reflection member 750 in the first reflection region R1, in which the thickness d4 of the reflection member 750 is less, is lower than a reflectance of the reflection member 750 in the second reflection region R2, in which the thickness d5 of the reflection member 750 is greater.

The display device 110 of FIG. 6 may display an image by using the light L1 emitted by the organic light-emitting element EL, and may perform a mirror function by using light L2 obtained when the reflection member 750 reflects external light while the organic light-emitting element EL does not emit the light L1.

Figure 9:
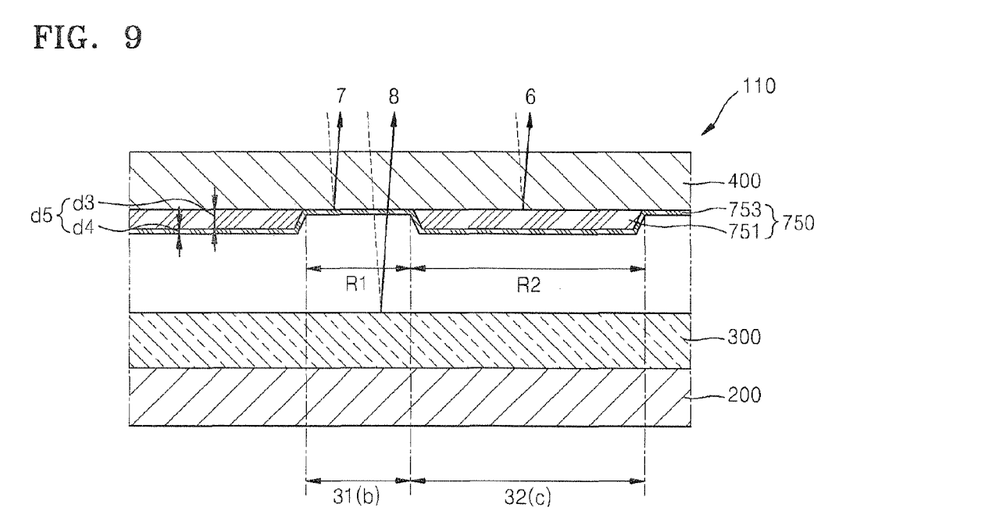
FIG. 9 is a cross-sectional view for explaining a mirror function of the display device of FIGS. 6 through 8.

FIG. 9 is a cross-sectional view for explaining a mirror function of the display device 110 of FIGS. 6 through 8.

Referring to FIG. 9, the reflection member 750 including the first reflection region R1 corresponding to the light-emitting region 31 and the second reflection region R2 corresponding to the non-light-emitting region 32 may be disposed on a surface of the second substrate 400. The thickness d4 of the reflection member 750 in the first reflection region R1 may be about 1/10 of the thickness d5 of the reflection member 750 in the second reflection region R2. Accordingly, a reflectance of the reflection member 750 in the first reflection region R1 may be lower than a reflectance of the reflection member 700 in the second reflection region R2.

While the organic light-emitting element EL in the light-emitting region 31 does not emit light, the display device 110 performs a mirror function by using a reflection of external light. The reflection of the external light may include a reflection 6 by the reflection member 750 in the second reflection region R2, a reflection 7 by the reflection member 750 in the first reflection region R1, and a reflection 8 by an electrode constituting the organic light-emitting element EL in the light-emitting region 31. The reflections 6 and 7 by the reflection member 750 include specular reflections and the reflection 8 by the organic light-emitting element EL may include diffuse reflection. When the first reflection film 751 and the second reflection film 753 are formed of the same material, a ratio of specular reflection to diffuse reflection is defined as shown in Equation 3.

$$\text{Specular reflection: diffuse reflection} = c \times C + b \times D{:}b \times B \times D' \times D' \quad (3),$$

where c is an area of the non-light-emitting region 32, C is a reflectance of the reflection member 750 in the second reflection region R2, D is a reflectance of the reflection member 750 in the first reflection region R1, D' is a transmittance of the reflection member 750 in the first reflection region R1, b is an area of the light-emitting region 31, and B is a reflectance of the organic light-emitting element EL.

A specular reflection component in Equation 3 may be higher by ($b \times D$) than a specular reflection component in Equation 1, and a diffuse reflection component may be lower by ($b \times B \times D' \times D'$) than a diffuse reflection component in Equation 1. Accordingly, since a specular reflection by the reflection member 750 in the first reflection region R1 corresponding to the light-emitting region 31 is increased and a diffuse reflection is minimized, blurring may be effectively prevented and mirror and display functions of the display device 110 may be efficiently performed.

Even when the first reflection film 751 and the second reflection film 753 are formed of different materials, since a specular reflection by the reflection member 750 in the first reflection region R1 corresponding to the light-emitting region 31 may be increased and a diffuse reflection may be minimized, blurring may be effectively prevented and mirror and display functions of the display device 110 may be efficiently performed.

A material of the second reflection film 753 disposed in the light-emitting region 31 may be determined by considering a transmittance. Since a transmittance of 80% means 20% reduction in efficiency, a transmittance of the second reflection film 753 directly affects efficiency of the display device 110. Accordingly, it is important to determine an appropriate transmittance of the second reflection film 753.

Figure 10:
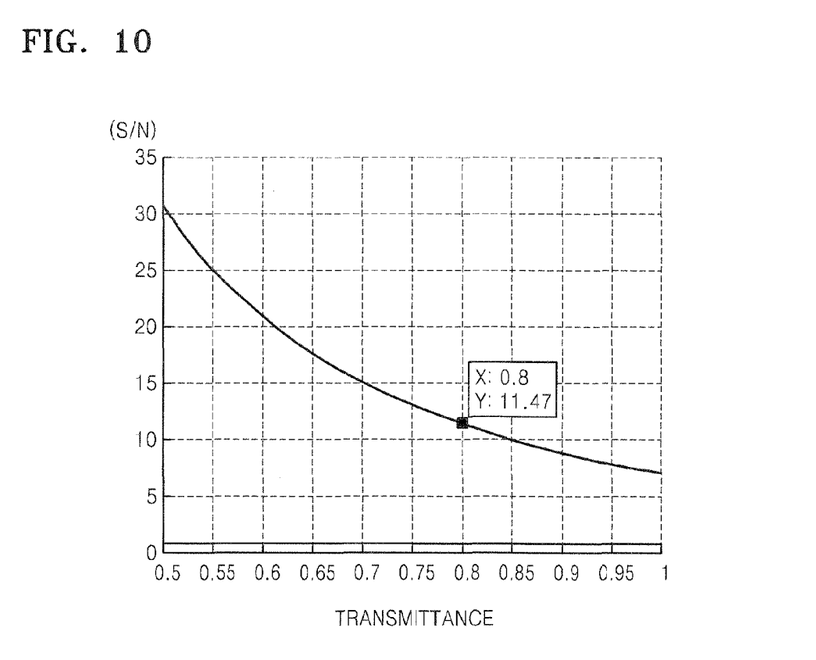
FIG. 10 is a graph illustrating a relationship between a thickness of a second reflection film and a signal to noise (S/N) ratio.

FIG. 10 is a graph illustrating a relationship between a thickness of the second reflection film 753 and a signal to noise (S/N) ratio, that is, a ratio of a specular reflection to a diffuse reflection. For example, a ratio of a specular reflection to a diffuse reflection when the light-emitting region 31 may include the second reflection film 753 formed of a material having a transmission ratio of 80% is higher by about 64% that when the light-emitting region 31 does not include the second reflection film 753 (that is, a transmittance of 100%). A transmittance of the second reflection film 753 may be appropriately determined in a range from about 50 to about 95%.

When the second reflection film 753 may be formed of a metal, it is important to form a uniform thin film. Since a too thin film is formed in an island shape in the first reflection region R1, a transmittance greatly varies according to a thickness. Also, when the second reflection film 753 may be formed in an island shape, a reflection by the second reflection film 753 in the first reflection region R1 is not a specular reflection. Accordingly, when a thin film with an appropriate thickness may be formed by connecting the second reflection film 753 in the first reflection region R1 and the second reflection region R2, a transmittance slightly varies according to a thickness.

Figure 11:
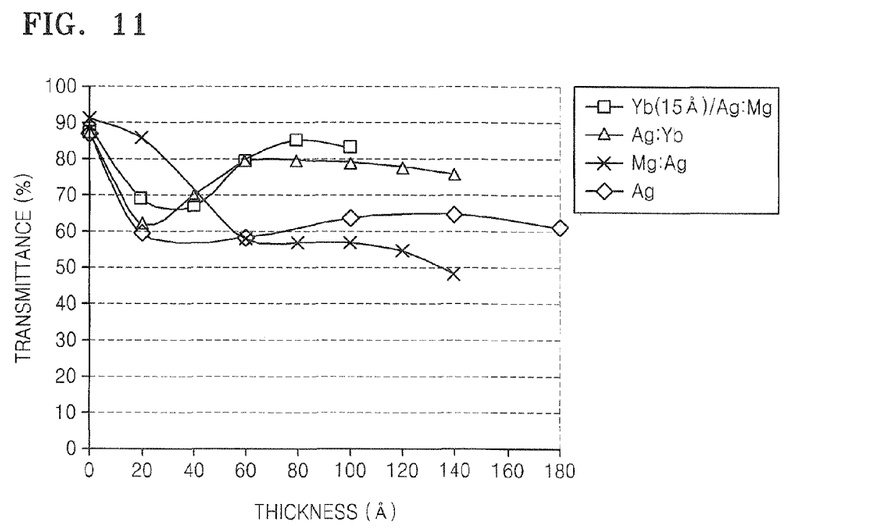
FIG. 11 is a graph illustrating a relationship between a thickness of a combination of various metals and a transmittance.

FIG. 11 is a graph illustrating a relationship between a thickness of a combination of various metals and a transmittance. Referring to FIG. 11, when a thickness is equal to or less than 20 Å, a transmittance varies greatly and may be unstable. When a thickness may be equal to or greater than 60 Å, a transmittance slightly varies, may be relatively stable, and uniform. Accordingly, the second reflection film 753 formed of a combination of one or more metals may be determined to have a thickness equal to or greater than 60 Å, and preferably, 60 Å to 180 Å, and an appropriate transmittance ranging from about 50% to about 95%.

Figure 12:
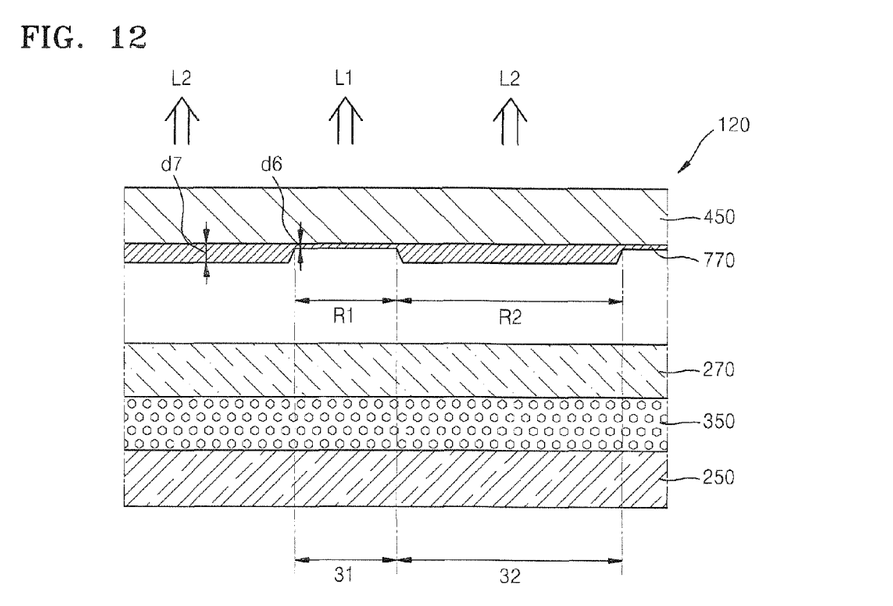
FIGS. 12 and 13 are cross-sectional views illustrating display devices according to other embodiments of the present invention.

FIG. 12 is a cross-sectional view illustrating a display device 120 according to another embodiment of the present invention.

Referring to FIG. 12, the display device 120 may include a first substrate 250, a second substrate 270, a liquid crystal layer 350 disposed between the first substrate 250 and the second substrate 270, and a third substrate 450.

The first substrate 250 and the second substrate 270 are adhered to each other by using a sealing member (not shown), and the liquid crystal layer 350 may be disposed between the first substrate 250 and the second substrate 270.

Each of the first substrate 250 and the second substrate 270 may be formed of a transparent glass material or a transparent plastic material having $SiO_2$ as a main component.

The first substrate 250 may include a plurality of pixels, and each of the plurality of pixels may include the light-emitting region 31 and the non-light-emitting region 32. Although not shown in FIG. 12, a pixel circuit including at least one TFT TR and a pixel electrode connected to the TFT TR are disposed in the light-emitting region 31.

A common electrode facing the pixel electrode and a color filter realizing a predetermined color display by using light are formed on a surface of the second substrate 270 facing the first substrate 250.

The third substrate 450 may be formed of a transparent glass material or a transparent plastic material having $SiO_2$ as a main component, like each of the first substrate 250 and the second substrate 270. A reflection member 770 may be formed on a surface of the third substrate 450. The reflection member 770 may be formed on a surface of the third substrate 450 facing the second substrate 270. The reflection member 770 may include the first reflection region R1 and the second reflection region R2 disposed around the first reflection region R1. The first reflection region R1 corresponds to the light-emitting region 31, and the second reflection region R2 corresponds to the non-light-emitting region 32. The reflection member 770 may extend to end portions of at least one side from among four sides of the third substrate 450. In this case, the second reflection region R2 may be disposed on end portions of the third substrate 450.

A thickness d6 of the reflection member 770 in the first reflection region R1 corresponding to the light-emitting region 31 may be less than a thickness d7 of the reflection member 770 in the second reflection region R2. Preferably, the thickness d6 of the reflection member 770 in the first reflection region R1 may be about 1/10 of the thickness d7 of the reflection member 770 in the second reflection region R2. For example, the thickness d7 of the reflection member 770 in the second reflection region R2 may be about 1000 Å. This is because the thickness d7 of about 1000 Å may lead to a transmittance of 0% and a reflectance of 95% or more. The thickness d6 of the reflection member 770 in the first reflection region R1 may be about 100 Å. This is because the thickness d6 of about 100 Å may lead to a transmittance of about 50% to about 95%.

The reflection member 770 may be a reflector formed of a material that may reflect external light, and may include a predetermined metal. For example, the reflection member 770 may include Al, Cr, Ag, Fe, Pt, Hg, Ni, W, V, or Mo.

The first reflection region R1 and the second reflection region R2 of the reflection member 770 may be formed of the same material. For example, the reflection member 770 having the thickness d6 in the first reflection region R1 may be formed by coating a reflection film on a surface of the third substrate 450 and then etching a portion of the reflection member 770 corresponding to the light-emitting region 31. Since the thickness d6 of the reflection member 770 in the first reflection region R1 and the thickness d7 of the reflection member 770 in the second reflection region R2 are different from each other, reflectances of the reflection member 770 in the first reflection region R1 and the reflection member 770 in the second reflection region R2 are different from each other. A reflectance of the reflection member 770 in the first reflection region R1, in which the thickness d6 of the reflection member 770 may be less, is lower than a reflectance of the reflection member 770 in the second reflection region R2, in which the thickness d7 of the reflection member 770 is greater.

Although the reflection member 770 in the first reflection region R1 and the reflection member 770 in the second reflection region R2 are formed of the same material, the present embodiment is not limited thereto. For example, the reflection member 770 in the first reflection region R1 may be formed of a material having a transmittance higher than that of the reflection member 770 in the second reflection region R2, and may be formed to a thickness less than that in the second reflection region R2.

The display device 120 of FIG. 12 may display a desired image on a screen by adjusting the amount of the light L1 emitted from a light source to be transmitted by adjusting an intensity of an electric field applied to the liquid crystal layer 350 of the light-emitting region 31, and may perform a mirror function by using the light L2 obtained when the reflection member 770 reflects external light while the image is not displayed. In this case, since the reflection member 770 corresponding to the light-emitting region 31 is included, diffuse reflection may be minimized and mirror function efficiency may be improved.

Figure 13:
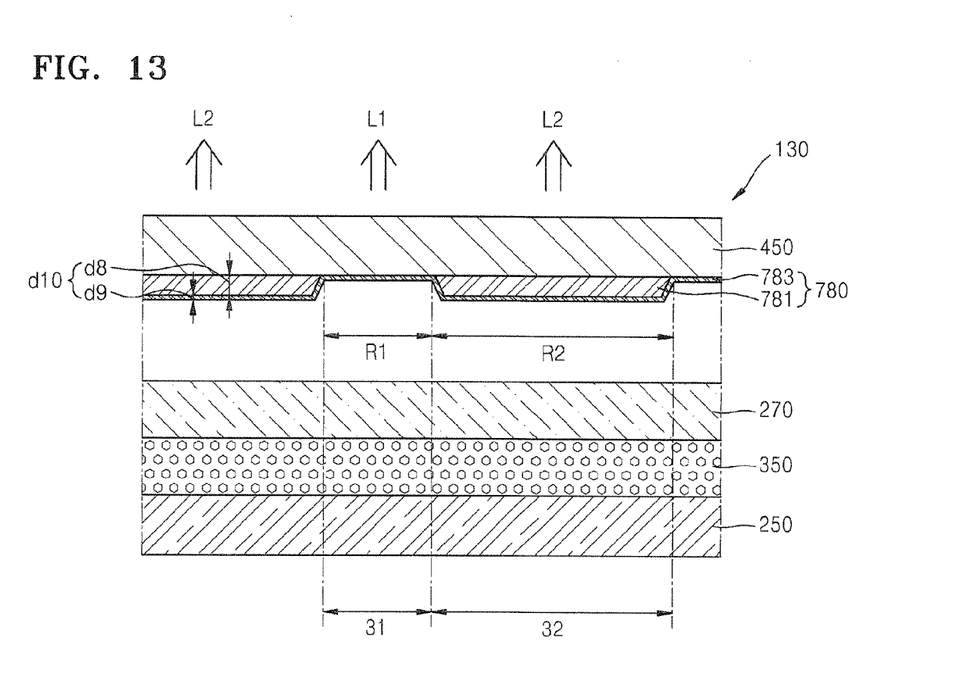

FIG. 13 is a cross-sectional view illustrating a display device 130 according to another embodiment of the present invention.

Referring to FIG. 13, the display device 130 may include the first substrate 250, the second substrate 270, a liquid crystal display (LCD) panel including the liquid crystal layer 350 disposed between the first substrate 250 and the second substrate 270, and the third substrate 450. The first substrate 250 and the second substrate 270 are adhered to each other by using a sealing member (not shown), and the liquid crystal layer 350 may be disposed between the first substrate 250 and the second substrate 270.

Each of the first substrate 250 and the second substrate 270 may be formed of a transparent glass material or a transparent plastic material having $SiO_2$ as a main component.

The first substrate 250 may include a plurality of pixels, and each of the plurality of pixels may include the light-emitting region 31 and the non-light-emitting region 32. Although not shown in FIG. 13, a pixel circuit including at least one TFT TR and a pixel electrode connected to the TFT TR are disposed in the light-emitting region 31.

A common electrode facing the pixel electrode and a color filter realizing a predetermined color display by using light are formed on a surface of the second substrate 270 facing the first substrate 250.

The third substrate 450 may be formed of a transparent glass material or a transparent plastic material having $SiO_2$ as a main component, like each of the first substrate 250 and the second substrate 270. A reflection member 780 may be formed on a surface of the third substrate 450. The reflection member 780 may be formed on a surface of the third substrate 450 facing the second substrate 270. The reflection member 780 may include the first reflection region R1 and the second reflection region R2 disposed around the first reflection region R1. The first reflection region R1 corresponds to the light-emitting region 31 and the second reflection region R2 corresponds to the non-light-emitting region 32. The reflection member 780 may be disposed to extend to ends of at least one side from among four sides of the third substrate 450. In this case, the second reflection region R2 may be disposed on end portions of the third substrate 450.

The reflection member 780 may include a first reflection film 781 and a second reflection film 783. The reflection member 780 in the first reflection region R1 corresponding to the light-emitting region 31 may include the second reflection film 783. The reflection member 780 in the second reflection region R2 corresponding to the non-light-emitting region 32 may include the first reflection film 781 and the second reflection film 783 which are sequentially stacked from the third substrate 450. Each of the first reflection film 781 and the second reflection film 783 may have a single-layer structure formed of a material including Al, Cr, Ag, Fe, Pt, Hg, Ni, W, V, or Mo. Alternatively, each of the first reflection film 781 and the second reflection film 783 may have a multi-layer structure in which any of the metals may be disposed between transparent conductive metal oxides. For example, each of the first reflection film 781 and the second reflection film 783 may have a three-layer structure such as ITO/Ag/ITO. A thickness d9 of the second reflection film 783 is less than a thickness d8 of the first reflection film 781.

A thickness of the reflection member 780 in the first reflection region R1 is equal to the thickness d9 of the second reflection film 783. A thickness of the reflection member 780 in the second reflection region R2 is equal to a sum d10 of the thickness d8 of the first reflection film 781 and the thickness d9 of the second reflection film 783. Preferably, the thickness d9 of the reflection member 780 in the first reflection region R1 is about 1/10 of the thickness d10 of the reflection member 780 in the second reflection region R2. For example, the thickness d10 of the reflection member 780 in the second reflection region R2 may be about 1000 Å. This is because the thickness d10 of about 1000 Å may lead to a transmittance of 0% and a reflectance of 95% or more. The thickness d9 of the reflection member 780 in the first reflection region R1 may be about 100 Å. This is because the thickness d9 of about 100 Å may lead to a transmittance of about 50% to about 95%.

The first reflection film 781 and the second reflection film 783 of the reflection member 780 may be formed of the same material. However, the present embodiment is not limited thereto, and as long as a transmittance of the reflection member 780 in the first reflection region R1 may be higher than a transmittance of the reflection member 780 in the second reflection region R2, the first reflection film 781 and the second reflection film 783 may be formed of different materials. For example, the reflection member 780 may be formed by coating the first reflection film 781 on a surface of the third substrate 450, completely etching a portion of the first reflection film 781 corresponding to the light-emitting region 31, and coating the second reflection film 783 formed of the same material as or a different material from that of the first reflection film 781 on an entire surface of the third substrate 450.

Since the thickness d9 of the reflection member 780 in the first reflection region R1 and the thickness d10 of the reflection member 780 in the second reflection region R2 are different from each other, reflectances of the reflection member 780 in the first reflection region R1 and the reflection member 780 in the second reflection region R2 are different from each other. A reflectance of the reflection member 780 in the first reflection region R1, in which the thickness d9 of the reflection member 780 is less, is lower than a reflectance of the reflection member 780 in the second reflection region R2, in which the thickness d10 of the reflection member 780 is greater.

The display device 130 may display a desired image on a screen by adjusting the amount of the light L1 emitted from a light source to be transmitted by adjusting an intensity of an electric field applied to the liquid crystal layer 350 of the light-emitting region 31, and may perform a mirror function by using the light L2 obtained when the reflection member 780 reflects external light while the image is not displayed. In this case, since the reflection member 780 corresponding to the light-emitting region 31 is included, diffuse reflection may be minimized and mirror function efficiency may be improved.

Although a top emission display device has been explained in the above embodiments, the present invention is not limited thereto and a bottom emission display device in which an image is displayed toward the first substrate 200 or 250 may be used. In this case, external light incident on the first substrate 200 or 250 may be reflected by the reflection film 700, 750, 770, or 780 formed on the third second substrate 400 or the third substrate 450, thereby performing a mirror function. Also, although a circuit for driving a light-emitting region overlaps with the light-emitting region in the above embodiments, the present invention is not limited thereto and a driving circuit may be disposed in a non-light-emitting region and may not overlap with the light-emitting region.

Figure 14A:
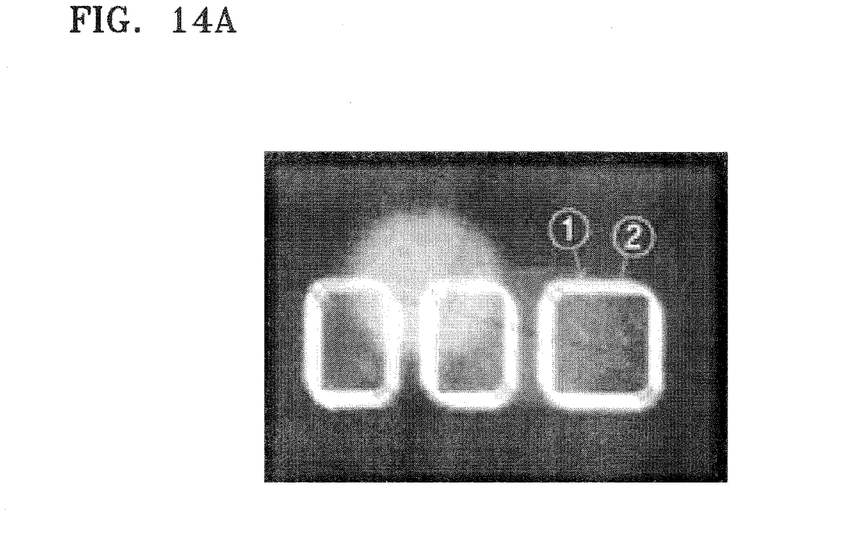
FIG. 14A illustrates an image taken utilizing the imaging system in a mirror display of a comparative example of the present invention illustrated in FIG. 4.
Figure 14B:
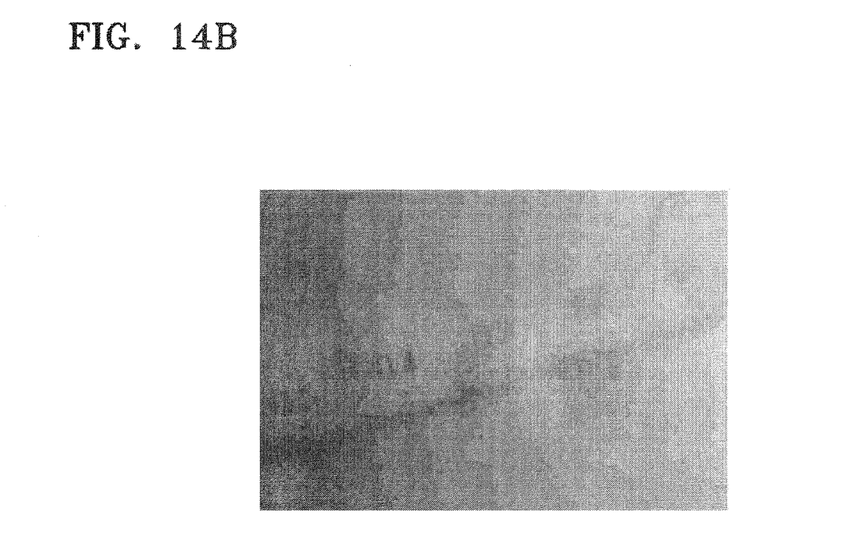
FIG. 14B illustrates an image showing a result of observing light in a perpendicular direction in a mirror display using the comparative example shown in FIG. 8 under the same condition as provided in FIG. 14A.

FIGS. 14A and 14B are provided a comparative examples of images generated by the present invention. FIG. 14A shows the result of making light incident at an incident angle α of about 40 degrees and observing the light in a perpendicular direction at an exposure time of two (2) seconds by using an imaging system in a mirror display having a structure of FIG. 4. FIG. 14B shows the result of observing light in a perpendicular direction in a mirror display having a structure of FIG. 8 under the same condition as provided in FIG. 14A. In FIG. 14A, a border diffuse reflection occurs in two (2) rows on a RGB pixel boundary surface, whereas, in FIG. 14B, the RGB pixel boundary surface becomes smooth and thus the border diffuse reflection is reduced.

Although an organic light-emitting display device and an LCD device have been described in the above embodiments, the present invention is not limited thereto and a display function and a mirror function may be performed by applying a reflection member having different thicknesses or reflectances (transmittances) to a display device having a light-emitting region and a non-light-emitting region.

The display device according to the present invention may include a relatively thick metal thin film having a thickness of 1000 Å or more in order to form a mirror having a high reflectance of about 100%, and an opening of the display device may include a relatively thin metal thin film having an appropriate transmittance in order to prevent efficiency reduction. Accordingly, the display device may improve reflection efficiency and perform a mirror function without reducing display efficiency.

As described above, since a reflection member having different thicknesses or different reflectances may be applied to a light-emitting region and a non-light-emitting region, a display device according to the present invention may perform mirror and display functions by maximizing a reflectance and a reflection quality without reducing display quality efficiency.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A display device, comprising:
a substrate; and
a reflection member that is disposed on a surface of the substrate and has a first thickness in a first reflection region corresponding to a light-emitting region and a second thickness in a second reflection region corresponding to a non-light-emitting region, said first thickness is different from said second thickness.

2. The display device of claim 1, wherein the first thickness is less than the second thickness.

3. The display device of claim 1, wherein a reflectance of the reflection member in the first reflection region is lower than a reflectance of the reflection member in the second reflection region.

4. The display device of claim 1, wherein the reflection member is formed of at least one selected from the group consisting of aluminum (Al), chromium (Cr), silver (Ag), iron (Fe), platinum (Pt), mercury (Hg), nickel (Ni), tungsten (W), vanadium (V), and molybdenum (Mo).

5. The display device of claim 1, wherein a transmittance of the reflection member ranges from about 50% to about 95%.

6. The display device of claim 1, wherein the reflection member in the second reflection region comprises a first reflection film and a second reflection film, and the reflection member in the first reflection region comprises the second reflection film.

7. The display device of claim 1, further comprising a second substrate that comprises a plurality of pixels comprising the light-emitting region and the non-light-emitting region on a surface of the second substrate facing the reflection member, and comprises an organic light-emitting element comprising a first electrode, a second electrode, and a light-emitting layer disposed between the first electrode and the second electrode in the light-emitting region.

8. The display device of claim 1, further comprising:
a first substrate on which a pixel electrode is formed in the light-emitting region;
a second substrate on which a common electrode facing the pixel electrode is formed; and
a liquid crystal layer that is disposed between the first substrate and the second substrate.

9. A display device comprising:
a substrate; and
a reflection member that is disposed on a surface of the substrate, has a first reflection region corresponding to a light-emitting region and a second reflection region corresponding to a non-light-emitting region, and comprises a first reflection film that is formed with a first thickness in the second reflection region and a second reflection film that is formed with a second thickness in the first reflection region and in the second reflection region in which the first reflection film is formed.

10. The display device of claim 9, wherein the second thickness is less than the first thickness.

11. The display device of claim 9, wherein a reflectance of the second reflection film is lower than a reflectance of the first reflection film.

12. The display device of claim 9, wherein the first reflection film and the second reflection film are formed of a same material or different materials.

13. The display device of claim 9, wherein each of the first reflection film and the second reflection film has a single-layer structure formed of at least one metal selected from the group consisting of aluminum (Al), chromium (Cr), silver (Ag), iron (Fe), platinum (Pt), mercury (Hg), nickel (Ni), tungsten (W), vanadium (V), and molybdenum (Mo), or a multi-layer structure comprising any of the metals.

14. The display device of claim 9, wherein a transmittance of the second reflection film ranges from about 50% to about 95%.

15. The display device of claim 9, wherein a thickness of the second reflection film ranges from about 60 Å to about 180 Å.

16. The display device of claim 9, further comprising a second substrate that comprises a plurality of pixels having the light-emitting region and the non-light-emitting region on a surface of the second substrate facing the reflection member, and comprises an organic light-emitting element comprising a first electrode, a second electrode, and a light-emitting layer disposed between the first electrode and the second electrode.

17. The display device of claim 9, further comprising:
a first substrate on which a pixel electrode is formed in the light-emitting region;
a second substrate on which a common electrode facing the pixel electrode is formed; and
a liquid crystal layer that is disposed between the first substrate and the second substrate.

18. A method of manufacturing a display device comprising a light-emitting region and a non-light-emitting region, the method comprising:
forming a first reflection member with a first thickness in a first reflection region corresponding to the light-emitting region on a surface of a substrate; and
forming a second reflection member with a second thickness in a second reflection region corresponding to the non-light-emitting region on the surface of the substrate.

19. The method of claim 18, wherein the first reflection member and the second reflection member are simultaneously formed by forming a first reflection film on the surface of the substrate and then removing a portion of the first reflection film in the first reflection region.

20. The method of claim 18, wherein the first reflection member and the second reflection member are separately formed by forming a first reflection film on the surface of the substrate and then removing the first reflection film in the first reflection region, and forming a second reflection film on the surface of the substrate from which the first reflection film is removed.

* * * * *